(12) United States Patent
Yasuda et al.

(10) Patent No.: US 8,426,878 B2
(45) Date of Patent: Apr. 23, 2013

(54) SEMICONDUCTOR LIGHT EMITTING DEVICE AND METHOD FOR MANUFACTURING SAME

(75) Inventors: Hidefumi Yasuda, Fukuoka-ken (JP); Yuko Kato, Fukuoka-ken (JP); Yasuharu Sugawara, Kanagawa-ken (JP); Toshiyuki Terada, Fukuoka-ken (JP); Kazuyoshi Furukawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/531,806

(22) Filed: Jun. 25, 2012

(65) Prior Publication Data

US 2012/0261707 A1    Oct. 18, 2012

Related U.S. Application Data

(62) Division of application No. 12/191,659, filed on Aug. 14, 2008, now Pat. No. 8,237,183.

(30) Foreign Application Priority Data

Aug. 16, 2007 (JP) .................. 2007-212100
Feb. 26, 2008 (JP) .................. 2008-044239

(51) Int. Cl.
*H01L 33/60* (2010.01)
(52) U.S. Cl.
USPC ............ 257/91; 257/93; 257/98; 257/99; 257/E33.001
(58) Field of Classification Search ........... 257/91, 257/93, 98, 99, E33
See application file for complete search history.

(56) References Cited

U.S. PATENT DOCUMENTS

| | | | | |
|---|---|---|---|---|
| 4,152,713 A | * | 5/1979 | Copeland et al. | 257/85 |
| 5,345,074 A | * | 9/1994 | Tonai et al. | 250/214.1 |
| 6,121,636 A | * | 9/2000 | Morita et al. | 257/99 |
| 6,828,596 B2 | * | 12/2004 | Steigerwald et al. | 257/99 |
| 6,933,160 B2 | | 8/2005 | Hon | |
| 7,041,529 B2 | * | 5/2006 | Yamada et al. | 438/93 |
| 7,573,074 B2 | * | 8/2009 | Shum et al. | 257/99 |
| 7,613,219 B2 | * | 11/2009 | Haberern et al. | 372/49.01 |

(Continued)

FOREIGN PATENT DOCUMENTS

| | | |
|---|---|---|
| JO | 2007-123573 | 5/2007 |
| JP | 2003-133588 | 5/2003 |

(Continued)

OTHER PUBLICATIONS

Office Action Issued Feb. 27, 2012 in Japanese Application No. 2008-044239 filed Feb. 26, 2008 (w/English translation).

(Continued)

*Primary Examiner* — Hrayr A Sayadian
(74) *Attorney, Agent, or Firm* — Oblon, Spivak, McClelland, Maier & Neustadt, L.L.P.

(57) ABSTRACT

A semiconductor light emitting device includes: a support substrate; a metal layer provided on the support substrate; a semiconductor layer provided on the metal layer and including a light emitting layer; a contact layer containing a semiconductor, selectively provided between the semiconductor layer and the metal layer, and being in contact with the semiconductor layer and the metal layer; and an insulating film provided between the semiconductor layer and the metal layer at a position not overlapping the contact layer.

4 Claims, 15 Drawing Sheets

U.S. PATENT DOCUMENTS

| | | | |
|---|---|---|---|
| 2003/0116771 A1* | 6/2003 | Wirth | 257/79 |
| 2003/0178636 A1* | 9/2003 | Kwan et al. | 257/186 |
| 2004/0135166 A1* | 7/2004 | Yamada et al. | 257/103 |
| 2005/0156185 A1* | 7/2005 | Kim et al. | 257/99 |
| 2006/0270075 A1 | 11/2006 | Leem | |
| 2008/0173885 A1* | 7/2008 | Kuromizu | 257/98 |

FOREIGN PATENT DOCUMENTS

| | | |
|---|---|---|
| JP | 2004-104085 | 4/2004 |
| JP | 2006-261407 | 9/2006 |
| JP | 2007-67198 | 3/2007 |
| WO | WO 2004/082033 A1 | 9/2004 |
| WO | WO 2006/006556 A1 | 1/2006 |

OTHER PUBLICATIONS

Office Action Issued may 11, 2012 in Japanese Application No. 2008-044239 filed Feb. 26, 2008 (w/English translation).

* cited by examiner

SEMICONDUCTOR LIGHT EMITTING DEVICE AND METHOD FOR MANUFACTURING SAME

CROSS-REFERENCE TO RELATED APPLICATIONS

This application is a division of and claims the benefit of priority under 35 U.S.C. §120 from U.S. Ser. No. 12/191,659 filed Aug. 14, 2008, and claims the benefit of priority under U.S.C. §119 from Japanese Patent Application No. 2007-212100 filed Aug. 16, 2007 and Japanese Patent Application No. 2008-044239 filed Feb. 26, 2008; the entire contents of each of which are incorporated herein by reference.

BACKGROUND OF THE INVENTION

1. Field of the Invention

This invention relates to a semiconductor light emitting device and a method for manufacturing the same.

2. Background Art

In a structure conventionally known as a reflection type semiconductor light emitting device, a semiconductor layer including a light emitting layer grown on a growth substrate is laminated with a support substrate via a metal layer so that light emitted opposite to the light extraction surface is reflected at the metal layer and directed to the light extraction surface (e.g., JP-A 2004-104086(Kokai)). In such a reflection type semiconductor light emitting device, reflectance at the reflecting structure contributes to increased brightness, and a higher reflectance is desired.

SUMMARY OF THE INVENTION

According to an aspect of the invention, there is provided a semiconductor light emitting device including: a support substrate; a metal layer provided on the support substrate; a semiconductor layer provided on the metal layer and including a light emitting layer; a contact layer containing a semiconductor, selectively provided between the semiconductor layer and the metal layer, and being in contact with the semiconductor layer and the metal layer; and an insulating film provided between the semiconductor layer and the metal layer at a position not overlapping the contact layer.

According to another aspect of the invention, there is provided a method for manufacturing a semiconductor light emitting device, including: selectively forming a contact layer containing a semiconductor on a surface of a semiconductor layer including a light emitting layer provided on a substrate; forming an insulating film on the surface of the semiconductor layer to cover the contact layer; selectively removing the insulating film to expose the contact layer; forming a metal layer covering the insulating film and the contact layer; and laminating a support with the metal layer, and then removing the substrate.

DETAILED DESCRIPTION OF THE INVENTION

Embodiments of the invention will now be described with reference to the drawings.

Figure 1:
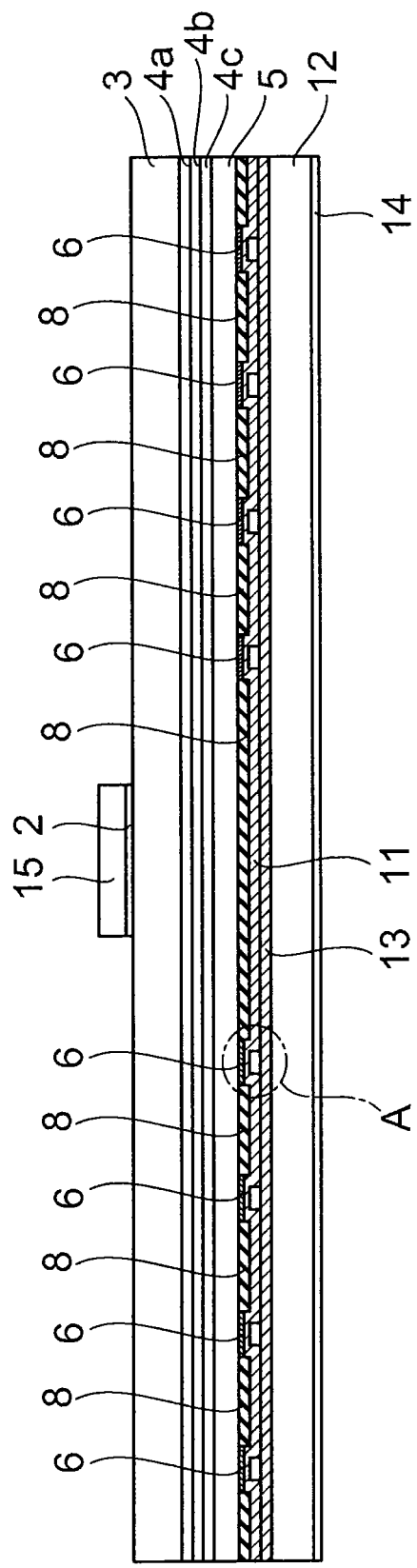
FIG. 1 is a cross-sectional view schematically showing the cross-sectional structure of a semiconductor light emitting device according to a first embodiment of the invention.
Figure 2:
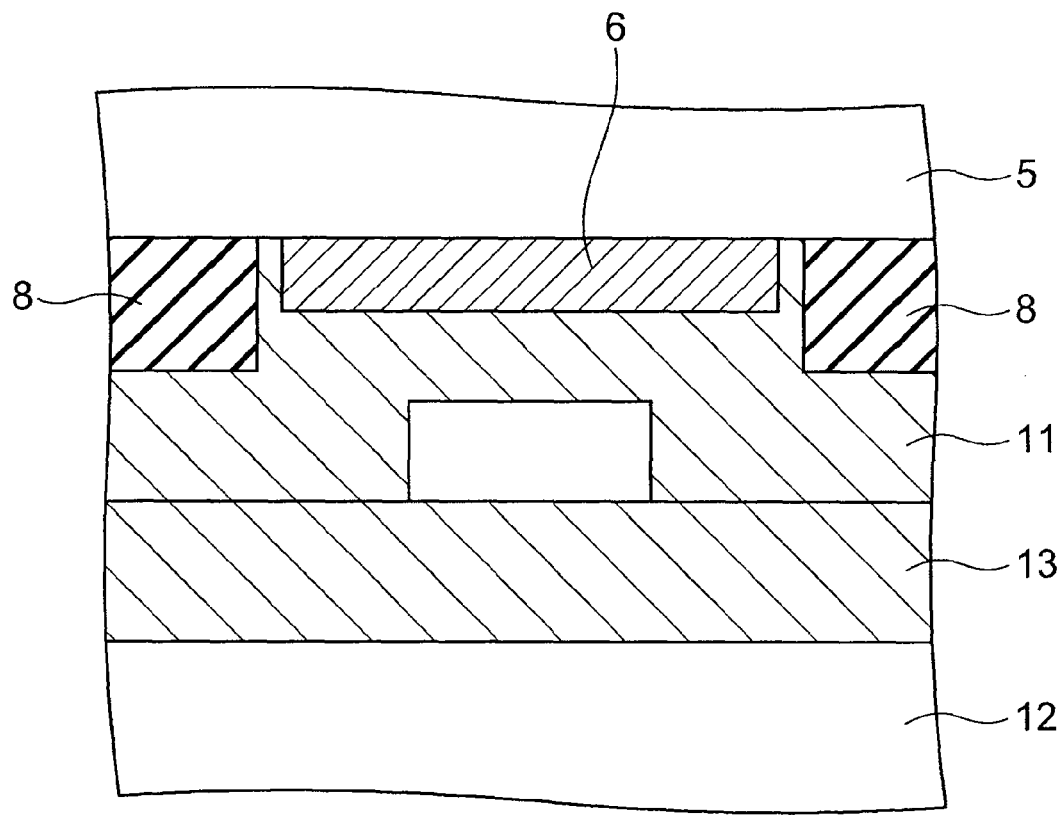
FIG. 2 is an enlarged view of portion A in FIG. 1.

FIG. 1 is a cross-sectional view schematically showing the cross-sectional structure of a semiconductor light emitting device according to a first embodiment of the invention. FIG. 2 is an enlarged view of portion A in FIG. 1.

The semiconductor light emitting device according to this embodiment comprises a semiconductor layer including a light emitting layer (active layer) 4b laminated with a support substrate 12 via metal layers 11, 13. In this semiconductor light emitting device, light is extracted from the side opposite to the support substrate 12, that is, from the upper side in FIG. 1.

The light emitting layer 4b can be illustratively made of an InGaAlP-based multiple quantum well structure. The light emitting layer 4b is sandwiched between an n-type cladding layer 4a and a p-type cladding layer 4c having a larger bandgap than the light emitting layer 4b.

An upper current diffusion layer 3 is provided above the n-type cladding layer 4a, and a lower current diffusion layer 5 is provided below the p-type cladding layer 4c. The upper current diffusion layer 3 and the lower current diffusion layer 5 are illustratively made of InGaAlP and serve to allow the current supplied through a bonding pad 15 and a backside electrode (p-side electrode) 14, which is formed on the backside of the support substrate 12, to diffuse in the in-plane direction.

The bonding pad 15 containing a metal material is provided on the upper current diffusion layer 3 via a contact layer 2 illustratively containing n-type GaAs. A wire for connection to an external circuit, not shown, is connected to the bonding pad 15.

Figure 3:
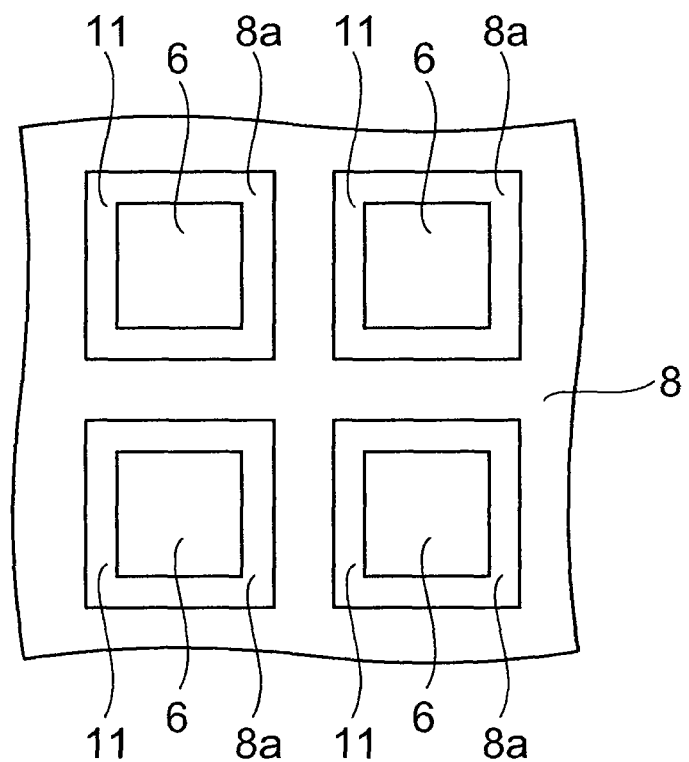
FIG. 3 is an enlarged schematic plan view showing an example planar layout of the contact layer and the insulating film in the semiconductor light emitting device according to this embodiment.

Contact layers 6 and an insulating film 8 are provided between the lower current diffusion layer 5 and the metal layer 11. FIG. 3 shows an example planar layout of the contact layers 6 and the insulating film 8.

The lower surface of the lower current diffusion layer 5 (the surface on the side opposite to the interface with the p-type cladding layer 4c) is a generally flat surface, on which a plurality of contact layers 6 are selectively formed. The insulating film 8 is formed on the lower surface of the lower current diffusion layer 5 at a position not overlapping the contact layers 6. That is, the surface of the semiconductor layer including the light emitting layer 4b on which the contact layers 6 and the insulating film 8 are formed is generally flat.

As shown in FIG. 3, a plurality of openings 8a are selectively formed in the insulating film 8, and one contact layer 6 is located in each of the openings 8a. In the example shown in FIG. 3, the planar shape of each contact layer 6 is rectangular. However, it is not limited thereto, but can be illustratively circular or polygonal.

The contact layer 6 is illustratively made of GaAs, and is in contact with the lower current diffusion layer 5 and the metal layer 11 so that the electrical connection therebetween has good ohmic characteristics.

The insulating film 8 serves as a reflecting layer by which the light emitted from the light emitting layer 4b to the side opposite to the light extraction surface on the upper current diffusion layer 3 side is reflected toward the light extraction surface. The insulating film 8 can illustratively be a silicon oxide film, silicon nitride film, or silicon oxynitride film having a lower refractive index than the semiconductor layer including the light emitting layer 4b.

The metal layer 13 is formed on the major surface of the support substrate 12 on the side to be laminated with the metal layer 11, and the metal layer 13 is laminated with the metal layer 11.

The support substrate 12 is conductive so as to ensure conduction between the bonding pad 15 and the backside electrode 14. For example, the support substrate 12 can be a silicon substrate, which is inexpensive and also easy to process. Other alternative substrate materials include Ge, InP, GaP, GaAs, GaN, and SiC.

Upon injection of a current into the light emitting layer 4b through the bonding pad 15 and the backside electrode 14, light is emitted from the light emitting layer 4b. The light emitted from the light emitting layer 4b toward the light extraction surface is extracted from the light extraction surface to the outside of the device. The light emitted from the light emitting layer 4b to the side opposite to the light extraction surface is reflected toward the light extraction surface at the interface between the semiconductor layer (lower current diffusion layer 5) and the insulating film 8 and extracted to the outside of the device.

Next, an example method for manufacturing a semiconductor light emitting device according to this embodiment is described with reference to FIGS. 4 to 6, in which the light emitting layer 4b and the cladding layers 4a and 4c shown in FIG. 1 are collectively shown as the light emitting layer 4.

Figure 4A:
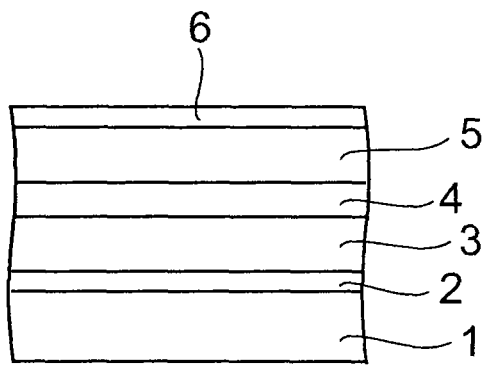
FIGS. 4A to 4C are schematic views showing an example method for manufacturing a semiconductor light emitting device according to the embodiment of the invention.

First, as shown in FIG. 4A, a contact layer 2, a current diffusion layer 3, a light emitting layer 4, a current diffusion layer 5, and a contact layer 6 are epitaxially grown in this order on a substrate 1. The substrate 1 is suitable to good epitaxial growth of the above layers, and can be illustratively made of GaAs for an InGaAlP-based light emitting device, and sapphire or SiC for a GaN-based light emitting device.

Figure 4B:
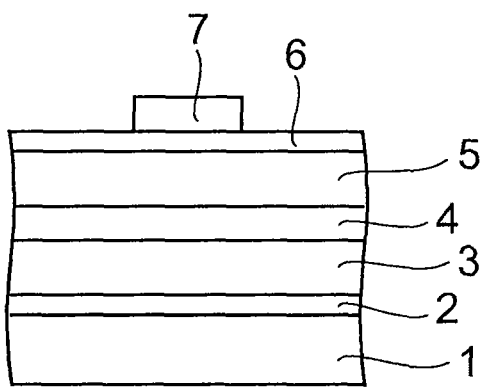
Figure 4C:
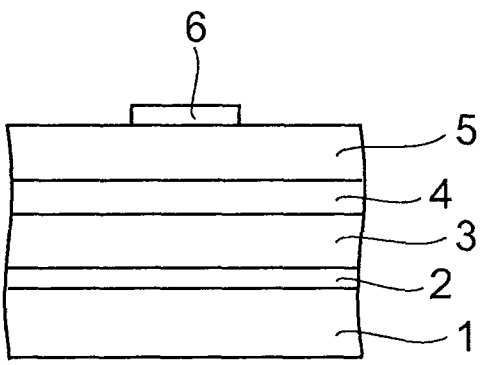

Next, as shown in FIG. 4B, the contact layer 6 is selectively etched using a mask 7, which is illustratively a silicon oxide film formed on the contact layer 6. Thus, as shown in FIG. 4C, the contact layer 6 is patterned in an island configuration. While only one contact layer 6 is shown in this figure, a plurality of contact layers 6 in an island configuration are left on the current diffusion layer 5 with a prescribed pitch. Because the current diffusion layer 5 is not etched, current diffusion is not impaired by the patterning of the contact layer 6.

Figure 5A:
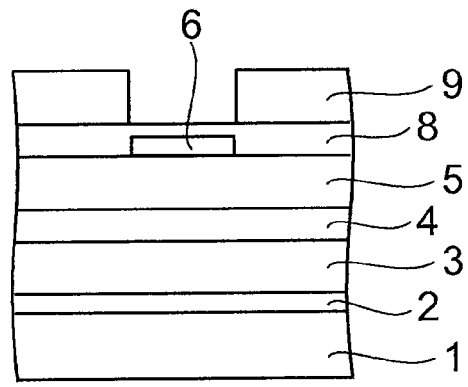
FIGS. 5A to 5C are schematic views showing steps following FIG. 4.
Figure 5B:
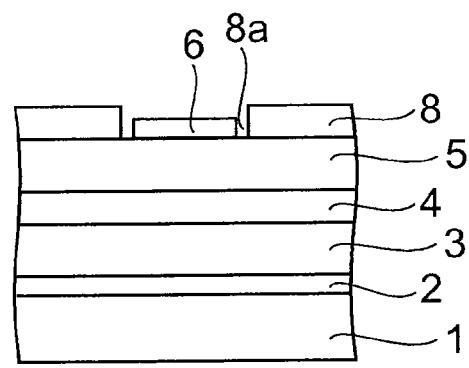

Next, as shown in FIG. 5A, an insulating film 8 is formed on the current diffusion layer 5 to cover the contact layer 6. Then, a mask 9 is used to etch away the insulating film 8 on the contact layer 6. Thus, as shown in FIG. 5B, the contact layer 6 is exposed. The opening 8a formed by this etching of the insulating film 8 corresponds to the opening 8a shown in FIG. 3.

The insulating film 8 is illustratively a silicon oxide film formed by CVD (chemical vapor deposition). Other alternative insulating materials include a silicon nitride film and a silicon oxynitride film. Furthermore, the insulating film 8 can also be formed by evaporation or sputtering.

Figure 5C:
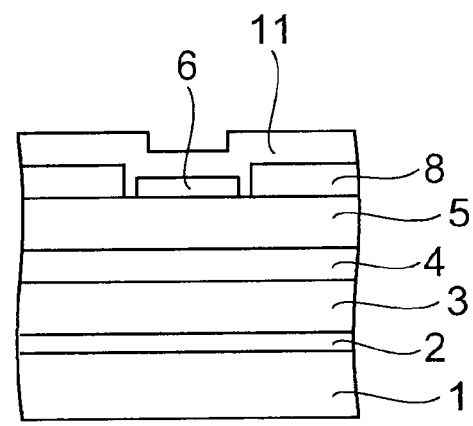

Next, as shown in FIG. 5C, a metal layer 11 is formed to cover the contact layer 6 and the insulating film 8. The contact layer 6 is in ohmic contact with the metal layer 11. The structure thus obtained is laminated with a support.

Figure 6A:
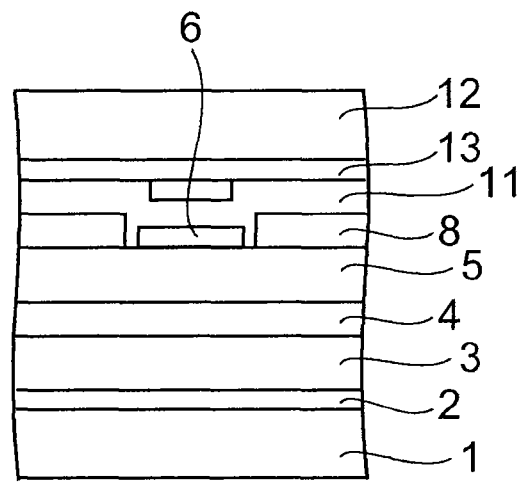
FIGS. 6A to 6C are schematic views showing steps following FIG. 5.

As shown in FIG. 6A, the support includes a support substrate 12 and a metal layer 13 formed on one surface thereof. The metal layer 11 and the metal layer 13 are desirably made of a material containing gold (Au).

Figure 6B:
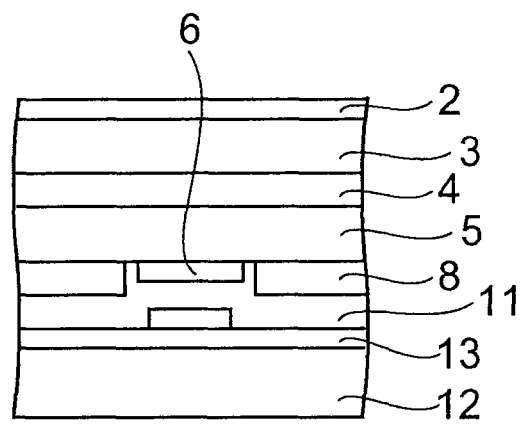

Subsequently, the substrate 1 used for epitaxial growth of the semiconductor layer including the light emitting layer 4 is removed illustratively by wet etching (FIG. 6B). In the case of quaternary systems such as InGaAlP like this embodiment, typically, the substrate (e.g., GaAs substrate) suitable for epitaxial growth of the semiconductor layer including the light emitting layer 4 highly absorbs the light emitted from the light emitting layer 4. Removal of such a substrate from the light extraction surface side increases the efficiency of extracting light to the outside of the device.

Figure 6C:
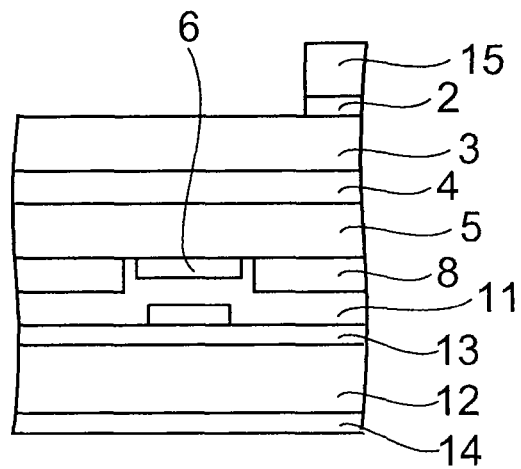

Subsequently, as shown in FIG. 6C, the contact layer 2 formed on the surface of the current diffusion layer 3 on the light extraction surface side is selectively etched away for patterning, and a bonding pad 15 is formed on the remaining contact layer 2. Furthermore, a backside electrode 14 is formed on the backside of the support substrate 12.

Figure 11A:
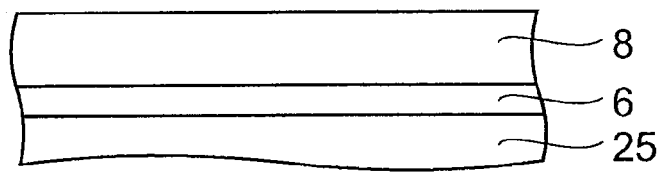
FIGS. 11A and 11B are enlarged cross-sectional views schematically showing the principal cross section of the semiconductor light emitting device according to the comparative example, having the contact layer formed on the entire surface.
Figure 11B:
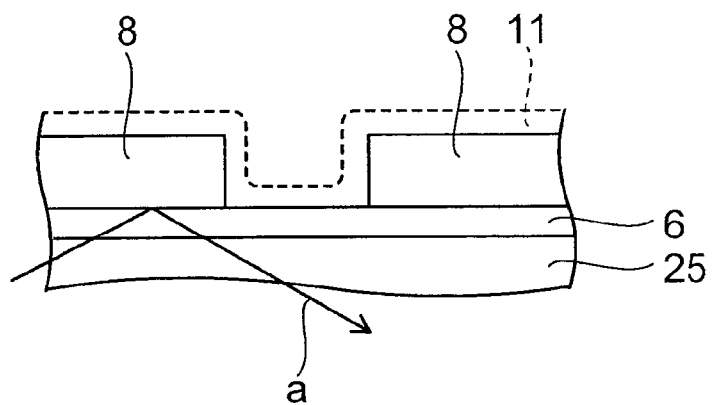

A reflection type semiconductor light emitting device, which has a structure allowing the light emitted from the light emitting layer to be totally reflected at an insulating film, may be configured as shown in a comparative example of FIG. 11A. In this comparative example, a contact layer 6 is provided on the entire surface of the semiconductor layer 25 including the light emitting layer, and then an insulating film 8 is formed on the contact layer 6, which is left on the entire surface without being patterned. Also in this case, to ensure ohmic contact between the contact layer 6 and the metal layer 11, an opening is formed in the insulating film 8 to selectively expose the contact layer 6 as shown in FIG. 11B.

In the structure of this comparative example, the contact layer 6 is present throughout the interface in the in-plane direction between the insulating film 8 and the semiconductor layer 25 including the light emitting layer. Hence, as shown by path a in FIG. 11B, the light emitted from the light emitting layer toward the insulating film 8 is transmitted through the contact layer 6, reflected at the insulating film 8, and again transmitted through the contact layer 6 toward the light extraction surface. Thus, the light reflected at the insulating film 8 passes twice through the contact layer 6.

Typically, the material of the contact layer 6 suitable for ensuring good ohmic contact between the metal layer 11 and the semiconductor layer 25 including the light emitting layer highly absorbs the light emitted from the light emitting layer. Consider an example in which the light emitting layer is made of InGaAlP, the contact layer 6 is made of GaAs, and the light emitting layer emits light at a wavelength of 630 nm. The absorption coefficient at this wavelength is 319 mm$^{-1}$ for the light emitting layer, but as large as 2823 mm$^{-1}$ for the contact layer 6. Hence, if the contact layer 6 is present throughout the interface between the semiconductor layer 25 and the insulating film 8, the light emitted toward the insulating film 8 is predominantly absorbed in the contact layer 6, and this optical absorption in the contact layer 6 decreases the brightness.

In contrast, in the semiconductor light emitting device according to this embodiment described above, the contact layer 6 is selectively formed, and the insulating film 8 is formed at a position not overlapping the contact layer 6. Thus, in this structure, the contact layer 6 with high absorption of light emitted from the light emitting layer is not present between the insulating film 8 and the semiconductor layer (current diffusion layer 5).

In view of the efficiency of current injection into the light emitting layer, the minimum requirement for the total area of the contact layer 6 is determined. While this contact area is ensured, the insulating film 8 is provided in the other portion. Thus, while optical absorption by the contact layer 6 is minimized, the area of reflection at the insulating film 8 without the intermediary of the contact layer 6 is increased to enhance the reflection efficiency. Consequently, the brightness can be increased.

The light reflectance can be made higher by using an insulating film for the reflecting layer than by using a metal. For example, the insulating film 8 implemented as a silicon oxide film enables total reflection. In 90% by volume of the incident hemisphere, a reflectance of 100% can be achieved in theory.

In contrast to the contact layer 6 formed on the entire surface as in the comparative example, a sample having the structure of this embodiment (the spacing between the contact layer 6 and the opening inner edge of the insulating film 8 is 2.5 μm) was prototyped so that the area ratio of the contact layer 6 is 6%, and was compared in brightness with the comparative example. Then, the sample having the structure of this embodiment delivered approximately twice the brightness relative to the comparative example.

For uniform and efficient current injection throughout the light emitting layer, it is preferable that the contact layer 6 be uniformly present in the in-plane direction. However, the portion below the bonding pad 15 does not serve as a light extraction surface, and does not contribute much to the light extraction efficiency, or brightness, even if the efficiency of current injection into the underlying light emitting layer is increased. Hence, in the example shown in FIG. 1, the contact layer 6 is not provided below the bonding pad 15.

Figure 7:
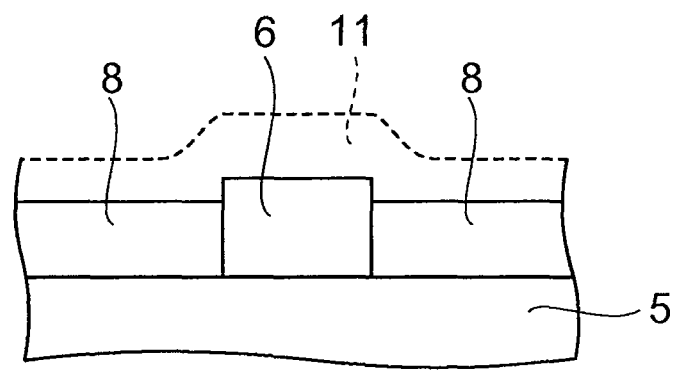
FIG. 7 is a schematic view showing an example of the semiconductor light emitting device according to this embodiment, having the contact layer thicker than the insulating film.

In the embodiment described above, the interface between the contact layer 6 and the current diffusion layer 5 is generally flush with the interface between the insulating film 8 and the current diffusion layer 5, and the insulating film 8 is thicker than the contact layer 6. Hence, the insulating film 8 protrudes from the contact layer 6 toward the metal layer 11. However, this invention is not limited to this structure. Alternatively, as shown in FIG. 7, the contact layer 6 can be thicker than the insulating film 8 and protrude therefrom toward the metal layer 11.

The metal layer 11 is formed to cover both the contact layer 6 and the insulating film 8 after they are formed. Hence, the shape of the metal layer 11 reflects the step difference between the contact layer 6 and the insulating film 8. As shown in FIGS. 1 and 2, if the contact layer 6 is recessed relative to the insulating film 8, the metal layer 11 below the contact layer 6 is recessed toward the contact layer 6, and the metal layer 11 below the insulating film 8 protrudes toward the metal layer 13. Conversely, as shown in FIG. 7, if the contact layer 6 protrudes from the insulating film 8, the metal layer 11 adjacent to the contact layer 6 protrudes toward the metal layer 13.

It is noted that, if the contact layer 6 has the same thickness as the insulating film 8, protrusions and depressions are scarcely formed in the metal layer 11, which can be favorably laminated with the metal layer 13 in a wide area. However, process controllability with high accuracy is required to form the contact layer 6 and the insulating film 8 with the same thickness at non-overlapping positions on the semiconductor layer surface. In contrast, in the structure of the insulating film 8 projected from the contact layer 6, good pressure bonding is achieved by a simple process. Furthermore, in the structure of the insulating film 8 projected from the contact layer 6, the pressure at the time of lamination is transferred to the wafer through the insulating film 8, and hence the pressure applied to the wafer can be alleviated.

FIGS. 8 and 9 show another example method for manufacturing a semiconductor light emitting device according to this embodiment.

Figure 8A:
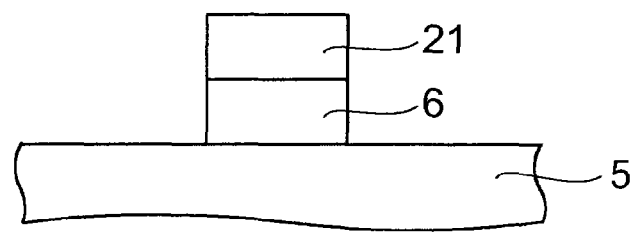
FIGS. 8A to 8C are schematic views showing another example method for manufacturing a semiconductor light emitting device according to the embodiment of the invention.

In this example, after a contact layer 6 is formed on the entire surface of the current diffusion layer 5, a cap layer 21 is further formed on the entire surface of the contact layer 6. Subsequently, by selectively etching the contact layer 6 and the cap layer 21 using the same mask, or by selectively etching the cap layer 21 and then selectively etching the contact layer 6 using the cap layer 21 as a mask, a structure as shown in FIG. 8A is obtained, in which the cap layer 21 is provided on the patterned contact layer 6.

The cap layer 21 has an etching selectivity with respect to the contact layer 6 and the insulating film 8. For example, in the case where the contact layer 6 is made of GaAs and the insulating film 8 is a silicon oxide film, the cap layer 21 can be made of a silicon nitride film or InGaP.

Figure 8B:
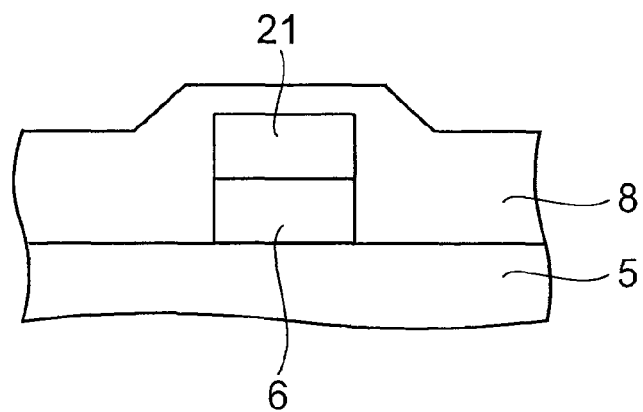
Figure 8C:
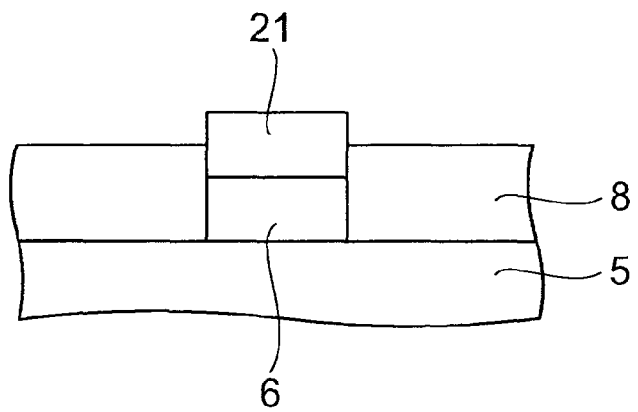

Next, as shown in FIG. 8B, an insulating film 8 is formed on the current diffusion layer 5 to cover the contact layer 6 together with the cap layer 21. Then, as shown in FIG. 8C, the insulating film 8 is etched back halfway through the cap layer 21. At this time, it is important that the cap layer 21 and the insulating film 8 are processed at a nearly equal etching rate. For example, in the case where the insulating film 8 is a silicon oxide film and the cap layer 21 is a silicon nitride film, RIE (reactive ion etching) processing using a gas system containing $CF_4$, $SF_6$, $CHF_3$, and $O_2$ is effective.

Figure 9A:
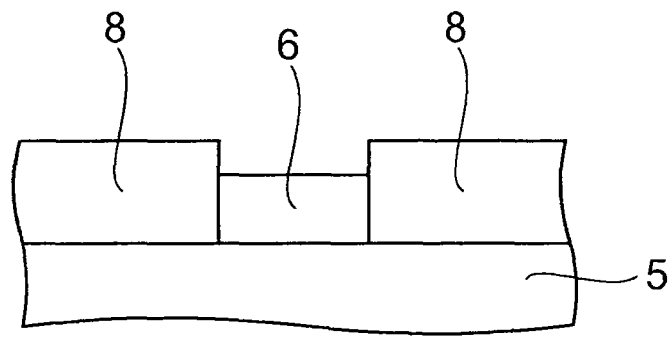
FIGS. 9A to 9C are schematic views showing steps following FIG. 8.

Subsequently, the cap layer 21 is selectively removed. Thus, a structure as shown in FIG. 9A is obtained, in which the upper surface of the contact layer 6 is exposed with the contact layer 6 recessed relative to the insulating film 8.

Figure 9B:
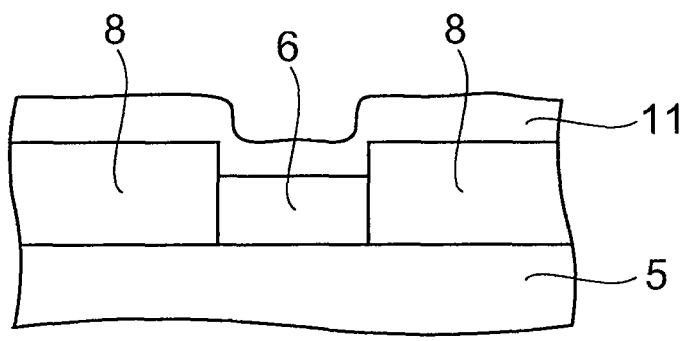
Figure 9C:
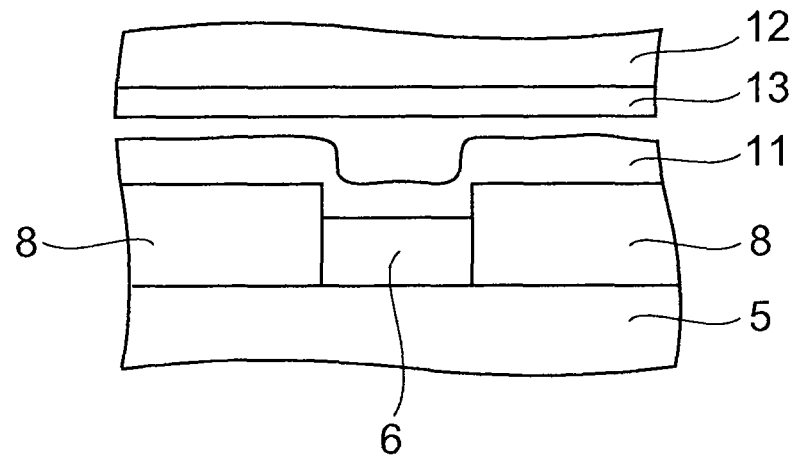

Subsequently, as shown in FIG. 9B, a metal layer 11 is formed to cover the contact layer 6 and the insulating film 8. Then, as shown in FIG. 9C, the metal layer 11 is laminated with a metal layer 13. Subsequently, steps similar to those of FIG. 6B and the following figures described above are performed.

In this example, the insulating film 8 is simply etched back throughout its surface without being patterned. Hence, it is possible to eliminate the clearance between the side surface of the contact layer 6 and the insulating film 8 due to positional misalignment of the etching mask used in patterning the insulating film 8.

As shown in FIG. 6C, the metal layer 11 is provided in the clearance between the side surface of the contact layer 6 and the insulating film 8. In this portion, instead of the insulating film 8, the metal layer 11 serves as a reflecting layer. Comparing the case of no clearance between the side surface of the contact layer 6 and the insulating film 8 with the case where the clearance exists, if the area of the contact layer 6 is equal, the existence of the clearance effectively reduces the area of the insulating film 8. Hence, as the clearance becomes smaller, the area of reflection at the insulating film 8, which allows higher reflectance than the metal layer 11, can be increased to enhance the brightness.

Figure 10:
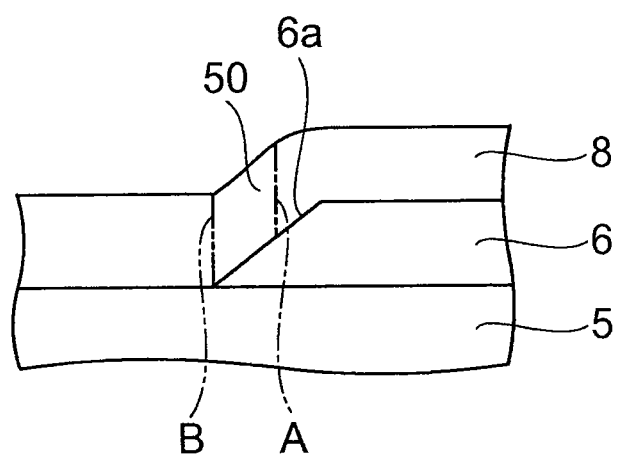
FIG. 10 is a schematic view for describing the positional relationship between the contact layer and the opening inner edge of the insulating film.

When the contact layer 6 is patterned, the cross section of the contact layer 6 typically tends to be shaped like a mesa as shown in FIG. 10 due to the plane orientation dependence of etching. In the process of FIGS. 5A and 5B, the insulating film 8 is formed to cover the contact layer 6, and then selectively removed above the contact layer 6 to expose the contact layer 6. At this time, if the insulating film 8 is removed only to position A shown by the dot-dashed line in FIG. 10, leaving part of the insulating film 8 on the tapered surface 6a of the contact layer 6, then a projection 50 is formed at the upper surface of the insulating film 8. The existence of this projection 50 may cause failure of lamination between the metal layer 11 formed on the insulating film 8 and the metal layer 13 formed on the support substrate 12, and thus is undesirable.

Hence, to avoid leaving the insulating film 8 on the tapered surface 6a of the contact layer 6, the insulating film 8 needs to be etched to a greater extent than the lower edge of the taper of the contact layer 6, illustratively to position B shown by the dot-dot-dashed line in FIG. 10.

The required width of spacing (clearance) between the contact layer 6 and the insulating film 8 surrounding its periphery is dictated by the etching shape of the contact layer 6. In the case where the contact layer 6 is shaped like a mesa as shown in FIG. 10, it is undesirable that the insulating film 8 is left on the tapered surface 6a as described above. Hence, the width of the tapered surface 6a of the contact layer 6 (the in-plane distance between the taper top and the taper bottom) is the minimum required width of the above clearance. For the shape in which the side surface of the contact layer 6 is generally perpendicular to the major surface of the underlying layer, the above clearance is desirably eliminated from the viewpoint of enhancing the reflectance by increasing the area of the insulating film 8. In practical manufacturing, the above clearance needs to be determined by also considering process controllability and variations. As the result of the inventors' study, it was found that the minimum required width of the clearance is desirably 0 or more and 10 micrometers or less.

Furthermore, the inventors made current distribution simulation for the device structure with the above contact layer 6 selectively formed, and obtained the result that the current density was increased in the portion of the light emitting layer directly above the contact layer 6 (the portion facing the contact layer 6). Specifically, in the range of approximately 1.85 times the width of the contact layer around the light emitting layer directly above the contact layer 6, the current density in the light emitting layer was higher than the other region.

Figure 12:
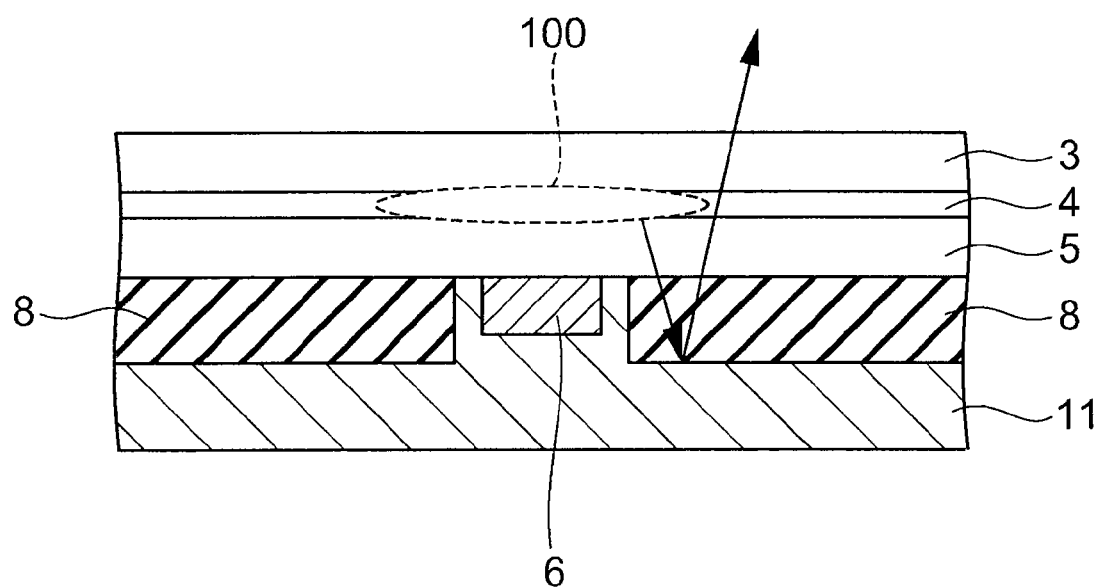
FIG. 12 is a schematic view for describing that the light emitted from the main light emitting region is hard to be totally reflected at the insulating film around the contact layer.

The region with high current density is a region with a large amount of light emission. FIG. 12 schematically shows the region with a large amount of light emission as a main light emitting region 100. In the case where the insulating film 8 is made of $SiO_2$ and the current diffusion layer 5 is made of InGaAlP, for example, the condition that the light emitted from the main light emitting region 100 toward the insulating film 8 is totally reflected at the interface between the insulating film 8 and the semiconductor layer (current diffusion layer 5) is that the incident angle of light with respect to the above interface is 26° (critical angle) or more.

The light incident on the above interface at an incident angle larger than the critical angle is totally reflected at the interface. However, the light from the main light emitting region 100 does not necessarily undergo total reflection throughout the above interface. More specifically, in the light emitted from the main light emitting region 100, the light component reaching the insulating film 8 with the shortest path is perpendicular to the above interface. Hence, in the portion of the insulating film 8 close to the contact layer 6 (the portion facing the main light emitting region 100), the light component with an incident angle smaller than the critical angle increases. As schematically shown by an arrow in FIG. 12, the light incident on the insulating film 8 at an angle smaller than the critical angle is transmitted through the insulating film 8 and reflected at the metal layer 11 underlying the insulating film 8. That is, in the surrounding portion of the contact layer 6, the light emitted from the main light emitting region 100 is not totally reflected at the insulating film 8, but transmitted through the insulating film 8 and reflected at the metal layer 11 therebelow. Thus, there is concern about brightness decrease due to the decrease of reflection efficiency.

Figure 13A:
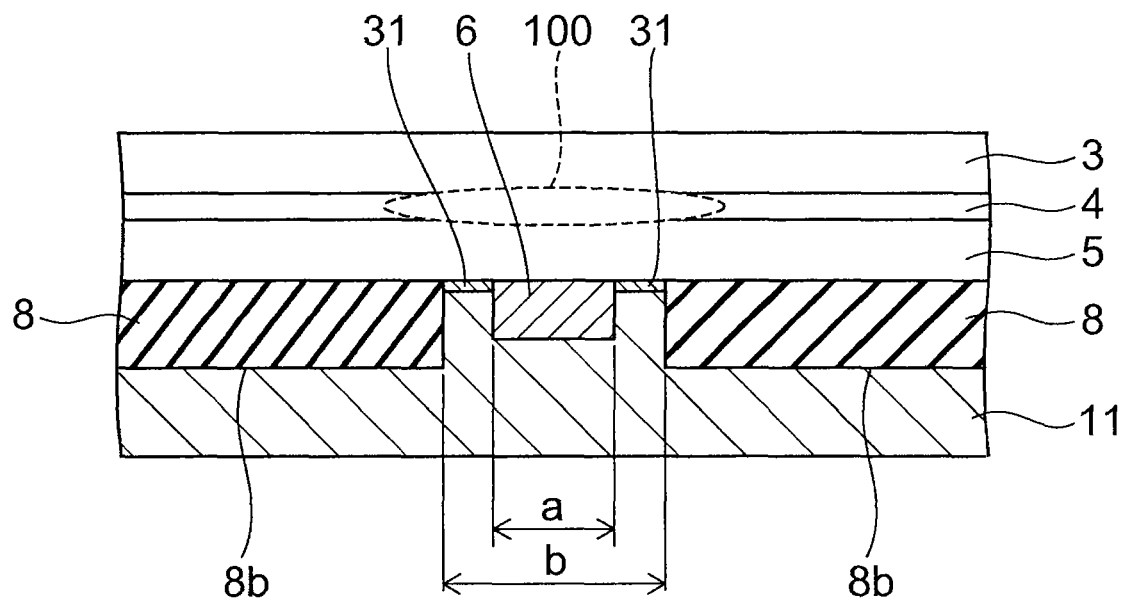
FIGS. 13A and 13B are schematic views showing the principal structure of a semiconductor light emitting device according to a second embodiment of the invention.
Figure 13B:
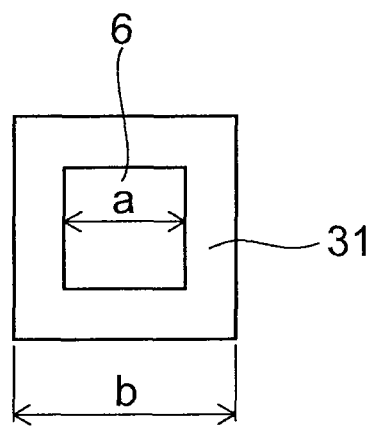

Hence, according to a second embodiment of the invention shown in FIG. 13, in the surrounding portion of the contact layer 6 where the light emitted from the main light emitting region 100 is difficult to be totally reflected, the insulating film 8 is not formed, but a highly reflective material 31 is provided therein. FIG. 13A shows the cross-sectional structure of the contact layer 6 and its surrounding portion, and FIG. 13B shows the planar layout of the contact layer 6 and the highly reflective material 31.

Here, the metal layer 11, being responsible for bonding when the semiconductor structure including the light emitting layer 4 is laminated with the support substrate, illustratively has a laminated structure of Ti, Pt, and Au. The surface of the metal layer 11 bonded to the insulating film 8 is illustratively made of Ti to ensure good adhesiveness with the insulating film 8. On the other hand, the surface of the metal layer 11 pressure-bonded to the metal layer 13 on the support substrate 12 side in the above step of FIG. 6A is made of Au for Au—Au bonding with the metal layer 13.

Because the insulating film 8 is not formed in the surrounding portion of the contact layer 6, a clearance is formed between the contact layer 6 and the insulating film 8. Hence, if the metal layer 11 is formed to cover the insulating film 8 and the contact layer 6 in the above step of FIG. 5C, the metal layer 11 is inserted into the above clearance. Here, in the example of the metal layer 11 of the above-described structure, Ti is used on the insulating film 8 side. Hence, the portion of the metal layer 11 in contact with the current diffusion layer 5 is made of Ti.

Ti has good adhesiveness with the insulating film 8 and the semiconductor layer. However, the reflectance of Ti with respect to light at a wavelength of approximately 630 to 640 nm, which is emitted illustratively from the InGaAlP-based light emitting layer 4, is as low as 0.333.

Thus, in this embodiment, a highly reflective material 31 is provided in the clearance portion between the insulating film 8 and the contact layer 6. The highly reflective material 31 is at least in contact with the current diffusion layer 5. The highly reflective material 31 is made of a material having a higher reflectance with respect to the light emitted from the light emitting layer 4 than the portion (Ti) of the metal layer 11 being in contact with (the backside 8b of) the insulating film 8. The highly reflective material 31 can be illustratively made of AuZn (the reflectance with respect to the light emitted from the light emitting layer 4 is 0.896), Au (the reflectance with respect to the light emitted from the light emitting layer 4 is 0.97), and transparent electrode materials, including ITO.

Thus, according to this embodiment, the light emitted from the main light emitting region 100 to the side opposite to the light extraction surface is reflected by the highly reflective material 31 in the surrounding portion of the contact layer 6, and is totally reflected by the insulating film 8 in the portion where incidence of light components with an incident angle larger than the critical angle increases. Consequently, the amount of reflection of the light emitted from the main light emitting region 100, which is a region with a large amount of light emission, toward the light extraction surface can be increased to enhance the brightness.

The width of the clearance formed between the contact layer 6 and the insulating film 8, that is, the range being devoid of the insulating film 8 and provided with a highly reflective material 31, needs to be appropriately designed. Spreading the highly reflective material 31 unnecessarily to the region allowing total reflection at the insulating film 8 results in decreasing the amount of reflected light. Hence, the highly reflective material 31 needs to be limited to a minimum required region (width) where the effect of total reflection at the insulating film 8 cannot be expected.

As the result of the inventors' study, it was found that the range of the highly reflective material 31 formed around the contact layer 6 (the width of the highly reflective material 31) b is desirably twice or less the width a of the contact layer 6. Under this condition, light reflection in the portion not allowing total reflection at the insulating film 8 is compensated by the highly reflective material 31 while making best use of the effect of total reflection at the insulating film 8, which accounts for a large part of the total area of the reflecting surface. Thus, this condition is effective in increasing the brightness. More specifically, in consideration of the current device design, process controllability, and process variations, it was found that the width of the highly reflective material 31 (the clearance width between the contact layer 6 and the insulating film 8) is desirably 10 micrometers or less.

FIG. 14 shows an example method for manufacturing the structure shown in FIG. 13.

Figure 14A:
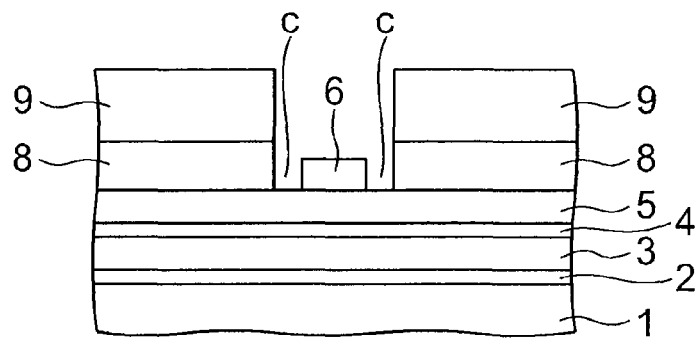
FIGS. 14A to 14D are schematic views showing an example method manufacturing the semiconductor light emitting device shown in FIGS. 13A and 13B.

Also in this embodiment, the insulating film 8 is formed on the current diffusion layer 5 to cover the contact layer 6 by the above steps of FIGS. 4A to 5A. Then, as shown in FIG. 14A, the insulating film 8 is selectively etched away using a mask 9 to expose the contact layer 6. Furthermore, by this etching, the insulating film 8 in the surrounding portion of the contact layer 6 is also removed to form a clearance c between the contact layer 6 and the insulating film 8.

Figure 14B:
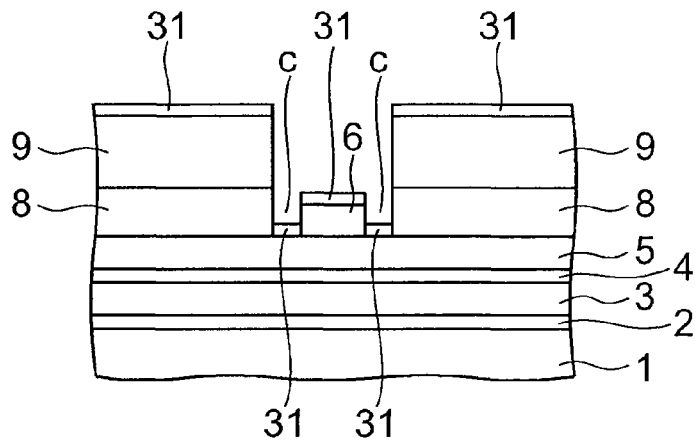

Next, with the mask 9 left on the insulating film 8, a highly reflective material 31 is formed illustratively by evaporation. Thus, as shown in FIG. 14B, the highly reflective material 31 is formed on the mask 9, on the contact layer 6, and on the current diffusion layer 5 exposed to the clearance c.

Figure 14C:
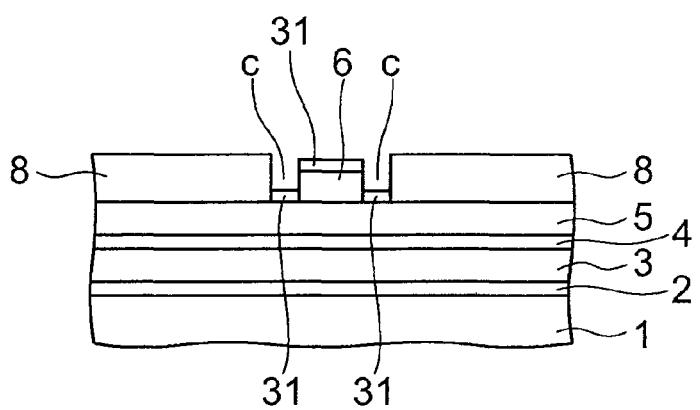

Next, the mask 9 is removed together with the highly reflective material 31 formed thereabove from above the insulating film 8 (lift-off). As shown in FIG. 14C, the highly reflective material 31 is left on the current diffusion layer 5 between the insulating film 8 and the contact layer 6 (clearance c) and on the contact layer 6. In the example shown in FIG. 14, the highly reflective material 31 on the contact layer 6 is left unchanged. Alternatively, for example, it can be etched away.

Figure 14D:
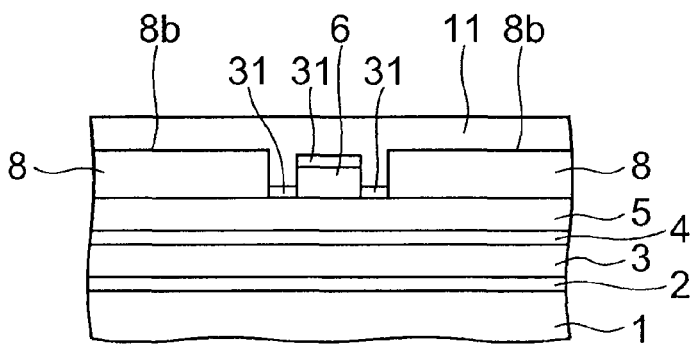

Next, as shown in FIG. 14D, the metal layer 11 is formed to cover the insulating film 8, the highly reflective material 31, and the contact layer 6. Subsequently, like the embodiment described above with reference to FIG. 6, a support substrate 12 is laminated by pressure bonding the metal layer 11 to a metal layer 13, and then the substrate 1 used for epitaxial growth of the semiconductor layer including the light emitting layer 4 is removed. Furthermore, by the steps of processing the contact layer 2 on the light extraction surface side, forming a bonding pad 15, and forming a backside electrode 14 on the backside of the support substrate 12 are performed, and a semiconductor light emitting device according to this embodiment is obtained.

The embodiments of the invention have been described with reference to the examples. However, the invention is not limited thereto, but can be variously modified in accordance with the spirit of the invention.

The material of each component is not limited to that described above, but other materials can be used. For example, the light emitting layer can be made of GaN-based materials. Furthermore, in accordance with the material of the light emitting layer, the material of the contact layer can also be suitably selected from GaAs, AlGaAs, AlGaN, GaN and the like.

With regard to the p-side electrode, instead of providing a backside electrode 14 on the backside of the support substrate 12, it is also possible to provide a region of the metal layer 13 on which the insulating film 8 and the semiconductor layer including the light emitting layer are not provided, and a bonding pad can be provided on the metal layer 13 in that region. In this case, the support substrate 12 can be non-conductive. Furthermore, the upper current diffusion layer and the lower current diffusion layer are not necessarily needed in the semiconductor layer including the light emitting layer.

Figure 15A:
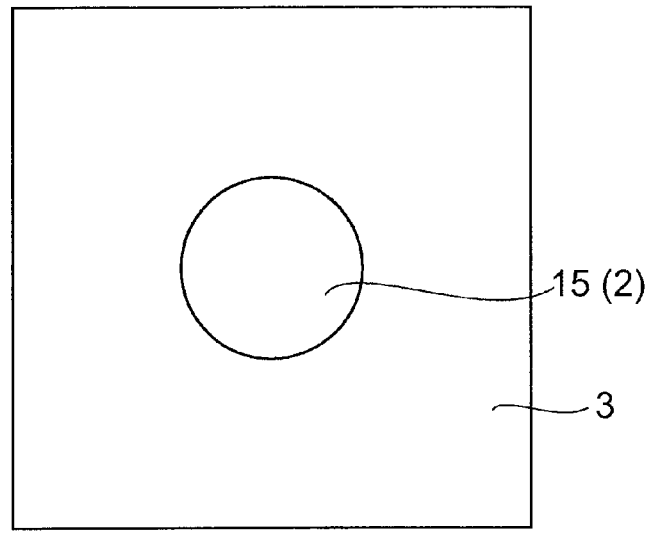
FIGS. 15A and 15B are schematic views illustrating an electrode pattern on the light extraction surface side in the semiconductor light emitting device according to the embodiments of the invention.

FIG. 15A is a schematic plan view showing an example electrode pattern provided on the light extraction surface side in the semiconductor light emitting device according to the embodiments of the invention.

In this example, an electrode pad (bonding pad) 15 and a contact layer 2 (see FIG. 1, for example) illustratively shaped like a circle are provided at the center on the surface of the semiconductor layer (in the present embodiments, for example, the upper current diffusion layer 3). The contact layer 2 can be formed by a patterning technique using the electrode pad 15 as a mask after forming the electrode pad 15 thereon. Alternatively, the contact layer 2 can be formed first by a pattering technique using appropriate mask such as a resist layer, then the electrode pad 15 can be formed on the contact layer 2.

Figure 15B:
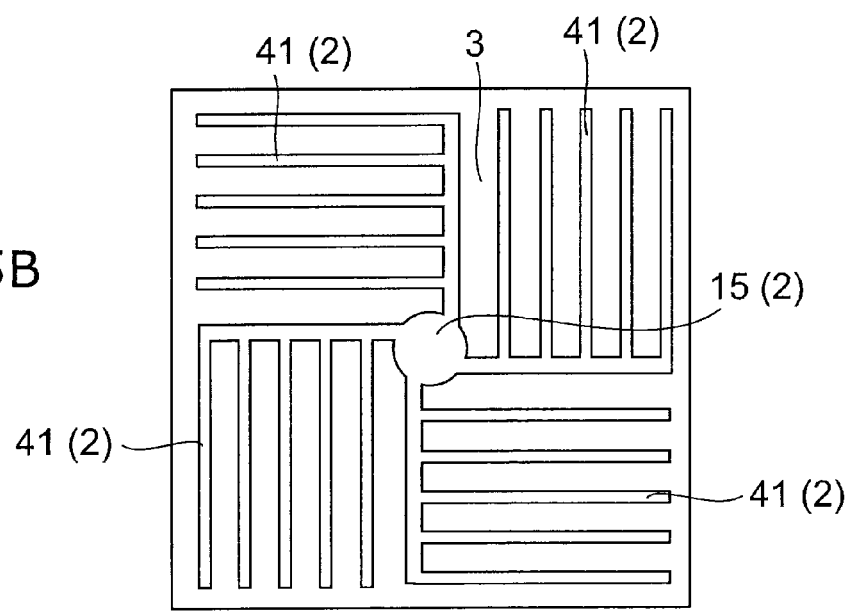

FIG. 15B is a schematic plan view showing another example electrode pattern provided on the light extraction surface side.

In this example, an electrode pad (bonding pad) 15 and a contact layer 2 illustratively shaped like a circle are provided at the center on the surface of the upper current diffusion layer 3, and a fine wire electrode 41 and a contact layer 2 connected to the electrode pad 15 and the contact layer 2 is further provided therearound. The fine wire electrode 41 is laid out evenly throughout the surface of the upper current diffusion layer 3. This structure is effective in evenly diffusing the current in the in-plane direction particularly for a large chip size.

The metal material (not limited to pure gold, but also including alloys) constituting the electrode pad 15 and the fine wire electrode 41 is impervious to light. The portion provided therewith does not serve as a light extraction surface, and improvement of light extraction efficiency cannot be expected even if the efficiency of current injection into the directly underlying light emitting layer is increased. Hence, the contact layer 6 described above is not formed directly below the electrode pad 15 and the fine wire electrode 41. That is, the pattern configuration of the electrode pad 15, the fine wire electrode 41, and the contact layer 6 is designed so that the contact layer 6 does not overlap the electrode pad 15 and the fine wire electrode 41.

The invention claimed is:

1. A semiconductor light emitting device comprising:
   a semiconductor layer having a lower surface and including a light emitting layer;
   a contact layer selectively provided in contact with the lower surface;
   an insulating film provided in contact with the lower surface so as to surround the contact layer and be spaced apart from the side surfaces of the contact layer, the insulating film being thicker than the contact layer;
   a reflective material provided between the contact layer and the insulating film, the reflective material in contact with the sides of the insulating and the contact layer and in contact with the lower surface; and
   a metal layer provided below and covering the contact layer, the insulating film and the reflective material; and
   a support substrate provided below the metal layer,
   wherein the reflective material is made of a material having a higher reflectance with respect to the light emitted from the light emitting layer than the metal layer.

2. The semiconductor light emitting device according to claim 1, wherein the insulating film is thicker than the contact layer and protrudes toward the metal layer.

3. The semiconductor light emitting device according to claim 1, wherein the width of the reflective material is equal to or less than twice the width of the contact layer.

4. The semiconductor light emitting device according to claim 1, wherein the reflective material contains at least one of AuZn, Au and ITO.

* * * * *